(12) United States Patent
Hanamori et al.

(10) Patent No.: US 7,373,570 B2
(45) Date of Patent: May 13, 2008

(54) LSI DEVICE HAVING SCAN SEPARATORS PROVIDED IN NUMBER REDUCED FROM SIGNAL LINES OF COMBINATORIAL CIRCUITS

(75) Inventors: Hiroyuki Hanamori, Tokyo (JP); Kenji Asai, Tokyo (JP); Hiroshi Yamasaki, Chiba (JP); Osamu Endoh, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 132 days.

(21) Appl. No.: 11/305,211

(22) Filed: Dec. 19, 2005

(65) Prior Publication Data

US 2006/0136796 A1   Jun. 22, 2006

(30) Foreign Application Priority Data

Dec. 20, 2004   (JP) .............................. 2004-367220

(51) Int. Cl.
*G01R 31/28* (2006.01)
(52) U.S. Cl. ................... 714/726; 714/30; 714/724; 714/727; 714/729
(58) Field of Classification Search ............ None
See application file for complete search history.

(56) References Cited

U.S. PATENT DOCUMENTS

| | | | | |
|---|---|---|---|---|
| 5,477,545 A | * | 12/1995 | Huang | ............... 714/727 |
| 5,592,493 A | * | 1/1997 | Crouch et al. | ............... 714/729 |
| 5,889,788 A | * | 3/1999 | Pressly et al. | ............... 714/726 |
| 6,374,380 B1 | * | 4/2002 | Sim | ............... 714/727 |
| 7,051,254 B2 | * | 5/2006 | Sugimoto | ............... 714/726 |
| 2002/0184582 A1 | * | 12/2002 | Pouya et al. | ............... 714/726 |
| 2004/0197941 A1 | * | 10/2004 | Takeoka et al. | ............... 438/18 |

FOREIGN PATENT DOCUMENTS

JP        2002-296323        10/2002

* cited by examiner

*Primary Examiner*—John P Trimmings
(74) *Attorney, Agent, or Firm*—Rabin & Berdo, PC

(57) ABSTRACT

A scan separator in a large scale integration device is made more extensive to suppress an increase in the circuit scale of the entire device. In one embodiment, a scan separator is provided for every two signal lines interconnecting two combinatorial circuit blocks. Each scan separator includes a selector and a flip flop for constituting a scan path. Another selector is provided for selecting one of the two signal lines. As an input selector signal for the selector that selects one of the two signal lines, data for switching controlling are used, which are transferred from a test input terminal over the scan path and latched by the flip flop. The data for switching controlling are initially transferred over the scan path to each flip flop. The selector that selects one of the two signal lines is switched in accordance with the switching controlling data stored in the flip flop. The switching controlling data may be interchanged to select the either of the two signal lines.

6 Claims, 4 Drawing Sheets

LSI DEVICE HAVING SCAN SEPARATORS PROVIDED IN NUMBER REDUCED FROM SIGNAL LINES OF COMBINATORIAL CIRCUITS

BACKGROUND OF THE INVENTION

1. Field of the Invention

The present invention relates to a semiconductor large scale integration (LSI) device including a scan test circuit.

2. Description of the Background Art

In a large scale integration device having complicated functions, a scan test is routinely used as an on-production test. In the scan test, as described in Japanese patent laid-open publication No. 2002-296323, a route, termed a scan path, is provided in advance between flip flops disposed on the input and output ports of plural combinatorial circuits, or circuit blocks, constituting a large scale integration device, these flip flops being concatenated together into a string when testing.

More specifically, test data are serially shifted through the flip flops on the scan path to be supplied in parallel in the form of input data to the circuit blocks. Data resultant from the testing and developed in parallel from the circuit blocks are temporarily held in the flip flops, and thereafter read out in series over the scan path. It is determined whether or not expected values corresponding to the test data have been obtained, thus verifying the functions of the circuit blocks. In such a scan test, it is necessary to use, at the outset, information on the circuit configuration, such as net list, in connection with the circuit blocks to prepare test data for a variety of functional tests and expected values thereof.

When a licensee manufactures a large scale integration device having a specific circuit block built therein under the license granted from a licensor, information on the circuit configuration for the specified circuit block may often not be available to the licensee. There may also be occasions where it is not desirable that the rate of detecting malfunction on a specific circuit block is affected by the configuration of another circuit interconnected thereto. In such cases, a scan separator circuit is often used for conducting a test with the scan path isolated.

Conventionally, a large scale integration device includes two circuit blocks, for example. The circuit blocks, i.e. the first and second blocks in the direction of flowing data signals, are interconnected with a plurality of scan separators, which are further interconnected in serial to each other to form a cascade of stages.

When test data are supplied to the second circuit block, one selector included in the scan separators is switched to form a scan path from the test input terminal of the first cascade stage through all of the scan separators to the test output terminal of the final cascade stage. Then, a corresponding plurality of bits of test data are sequentially received in series on the test input terminal in synchronism with clock signals supplied to the plurality of the scan separators. This causes the bits of test data to be retained in the respective scan separators. The other selector of the scan separators is in turn switched to output the bits of test data in parallel to the second circuit block.

When reading out data resultant from the processing by the first circuit block, the first selector of the scan separators is switched to receive a corresponding plurality of signals from the first circuit block to latch them. When the scan separators are supplied with one pulse of the clock signals, they latch the signals thus received.

The selectors of the scan separators are then switched to form the scan path from the test input terminal through the scan separators to the test output terminal. When the scan separators receive the clock signals, they sequentially shift the data thus latched along the scan path through the cascaded stages in synchronism with the clock signals to serially output the bits of test data from the test output terminal.

With the above-described large scale integration device, it was necessary to provide a corresponding plurality of scan separators to the number of the signals transferred from the first circuit block to the second circuit block of interest, thus increasing the scale of the entire circuit. The scan separators are used only for on-manufacture testing, and not at all when operating in the ordinary use of the integrated circuit although it is desirable to minimize the circuit scale required.

It is an object of the present invention to make the scan separator more intensive to suppress the circuit scale of the large scale integration device from increasing.

A semiconductor integrated circuit according to the present invention comprises a first circuit block, a second circuit block and a plurality of scan separators transferring in ordinary operation, signals between the first and second circuit blocks, and isolating, in testing operation, the first and second circuit blocks from each other. Each of the scan separators is provided for every two signals transferred from the first circuit block to the second circuit block.

More specifically, the scan separator includes a first selector for selecting one of two signals, output from the first circuit block, in response to an input selector signal, a second selector for selecting scan data afforded from outside or from one of the scan separators in one of the cascaded stages which precedes when receiving a scan control signal, the second selector being adapted for selecting an output signal of the first selector when not receiving the scan control signal, a flip flop for holding an output signal of the second selector to output the output signal in the form of scan data to outside or to one of the scan separators which follows in the cascaded stages, and for sending the output signal to the first selector as the input selector signal in response to a clock signal, and a third selector for selecting the two signals or the output signal of the flip flop in response to an output selector signal, and for affording a selected signal to the second circuit block.

Further according to the present invention, each of the scan separators is provided for two signals. Hence, the scan separator may be made more intensive than a conventional large scale integration device where each scan separator is provided for one signal, with the result that the circuit scale of the entire large scale integration device may be suppressed from increasing.

Alternatively, each of the scan separators is provided for four of the signals transferred from the first circuit block to the second circuit block. Each of the scan separators includes a first selector for selecting one of the four signals output from the first circuit block in accordance with a combination of a first input selector signal and a second input selector signal. The first input selector signal is scan data supplied from outside or from one of the scan separators in one of the cascaded stages which precedes. Each of the scan separators further includes a second selector for selecting scan data supplied from outside or from one of the scan separators in the cascaded stages which precedes when receiving a scan control signal, and for selecting an output signal of the first selector when not receiving the scan control signal. Each scan separator also includes a flip flop for holding an output signal of the second selector to output the output signal in the form of scan data to outside or to one of the scan separators which follows in the cascaded stages, and for sending the output signal to the first selector as the second input selector signal in response to a clock signal, and a third selector for selecting the four signals or the output signal of the flip flop in response to an output selector signal, and for affording a selected signal to the second circuit block.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 2:
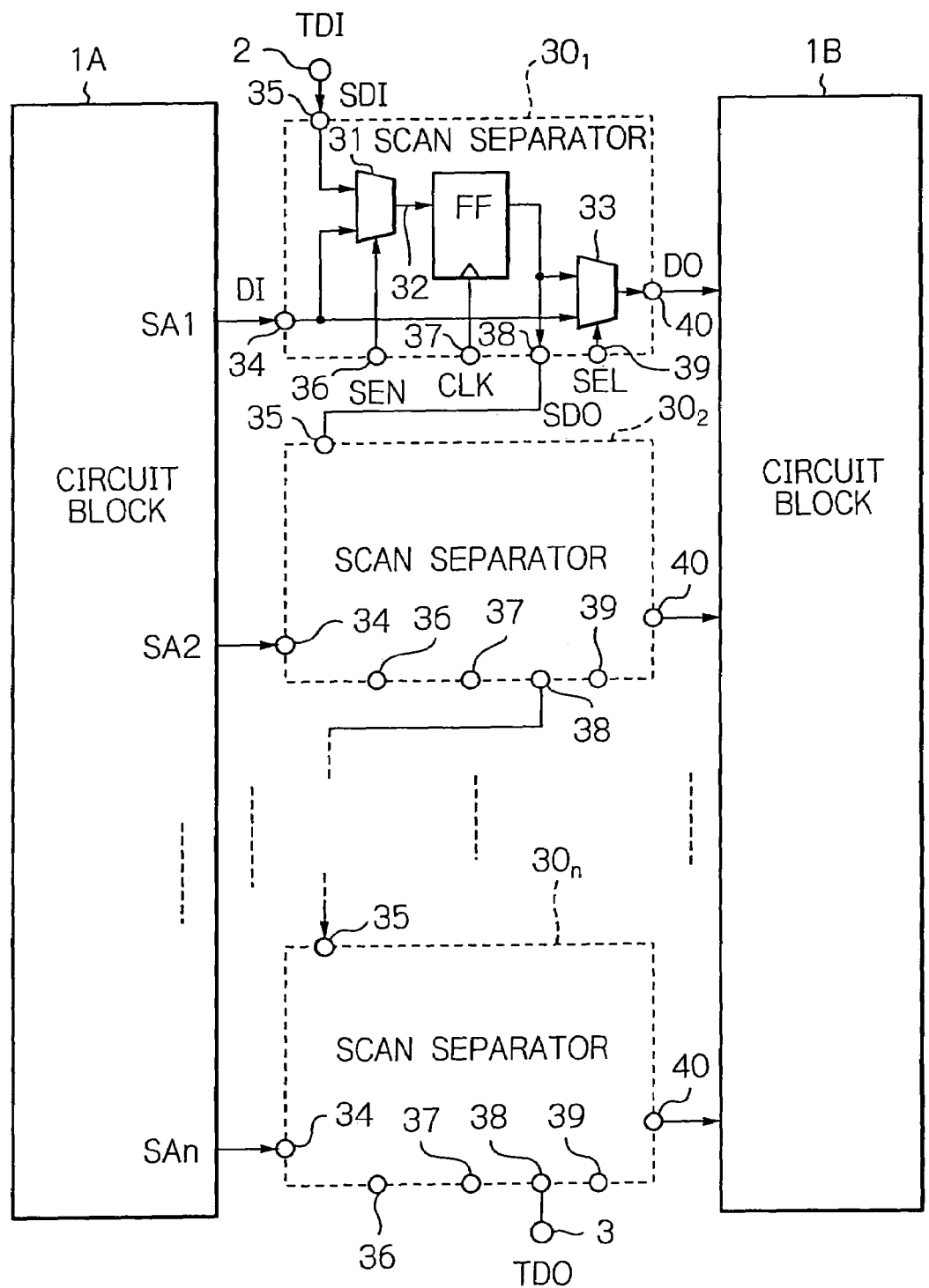
FIG. 2 is a schematic circuit diagram showing a large scale integration device provided with a conventional scan separator.

Prior to describing the embodiments of the invention, the configuration of a large scale integration device having conventional scan separators will be described with reference to FIG. 2 for better understanding of the invention. The large scale integration device illustrated includes circuit blocks 1A and 1B, and a plurality of scan separators $30_1$ to $30_n$, interconnecting the circuit blocks 1A and 1B. The scan separators $30_1$ to $30_n$ are provided for signals SA1 to SAn, respectively. The scan separators $30_1$ to $30_n$ are of the same configuration, and each include selectors 31 and 33, and a flip flop (FF) 32. Like parts or components are designated with the same reference numerals.

Specifically, the scan separator 30 includes a data input terminal 34, supplied with input data DI from the circuit block 1A, and a scan input terminal 35, supplied with scan data SDI from outside or from a scan separator 30 of the previous stage. The data input terminal 34 is connected to a first input port of the selectors 31 and 33, while the scan input terminal 35 is connected to the second input port of the selector 31. The selector 31 is switchable in response to a scan control signal SEN supplied to a scan control terminal 36.

The selector 31 has its output port connected to the input port of the flip flop 32. The flip flop 32 latches input data in time with a clock signal CLK applied to a clock terminal 37. The flip flop 32 has its output port connected to the second input port of the selector 33 and to a scan output terminal 38 outputting a scan output signal SDO. The selector 33 is switched in response to an output selector signal SEL applied to its selector terminal 39. The so selected data are output from a data output terminal 40 in the form of output data DO, and thence supplied to the other circuit block 1B.

The scan input terminal 35 of the scan separator $30_1$ in the initial stage is connected to a test input terminal 2, serially supplied with test data TDI from outside. The scan output terminal 38 of the scan separator $30_n$ on in the last stage is connected to a test output terminal 3 for outputting to outside test data TDO, representing the results of the processing.

In operation, when test data are supplied to the circuit block 1B, the selectors 31 of the scan separators $30_1$ to $30_n$ are switched to the second input ports 35. This forms a scan path from the test input terminal 2 through the selectors 31 and the flip flops 32 of the scan separators $30_1$ to $30_n$ to the test output terminal 3.

Then, n-bit test data TDI are sequentially supplied in series from the test input terminal 2 in synchronism with the clock signal CLK. This causes the n-bit test data TDI to be retained in the flip flops 32 of the scan separators $30_1$ to $30_n$. The selectors 33 of the scan separators $30_1$ to $30_n$ are switched in this state to the second input ports in response to the output selector signal SEL. This applies the n-bit test data TDI to the circuit block 1B in parallel.

When reading out data showing the results of processing by the circuit block 1A, the selectors 31 of the scan separators $30_1$ to $30_n$ are switched to the first input ports 34. This applies the signals SA1 to SAn of the circuit block 1A to the input ports of the flip flops 32 of the scan separators $30_1$ to $30_n$. When, in this state, one clock pulse of the clock signal CLK is supplied, the signals SA1 to San, representing the results of the processing of the circuit block 1A, are latched in the flip flops 32 of the scan separators $30_1$ to $30_n$.

The selectors 31 of the scan separators $30_1$ to $30_n$ are then switched to the second input ports in response to a scan control signal SEN. This forms a scan path from the test input terminal 2 through the selectors 31 and the flip flops 32 of the scan separators $30_1$ to $30_n$ to the test output terminal 3. When the clock signal CLK is applied in this state, data resultant from the processing of the circuit block 1A, latched in the flip flops 32 of the scan separators $30_1$ to $30_n$, are sequentially shifted in synchronism with the clock signal CLK to be serially output in the form of n-bit test data TDO from the test output terminal 3.

When reading out the data of the processing results of the circuit block 1A from the test output terminal 3, the test data for the circuit block 1B may be shifted and supplied from the test input terminal 2, whereby the data representing the results of the processing may be read out from the circuit block 1A simultaneously with test data being supplied to the circuit block 1B.

In the ordinary operation, the selectors 33 of the scan separators $30_1$ to $30_n$ are switched to the first input ports 34 in response to the output selector signal SEL. This connects the data input terminals 34 of the scan separators $30_1$ to $30_n$ to the data output terminal 40 via the selectors 33, so that the signals SA1 to SAn of the circuit block 1A are directly sent to the circuit block 1B.

Figure 1:
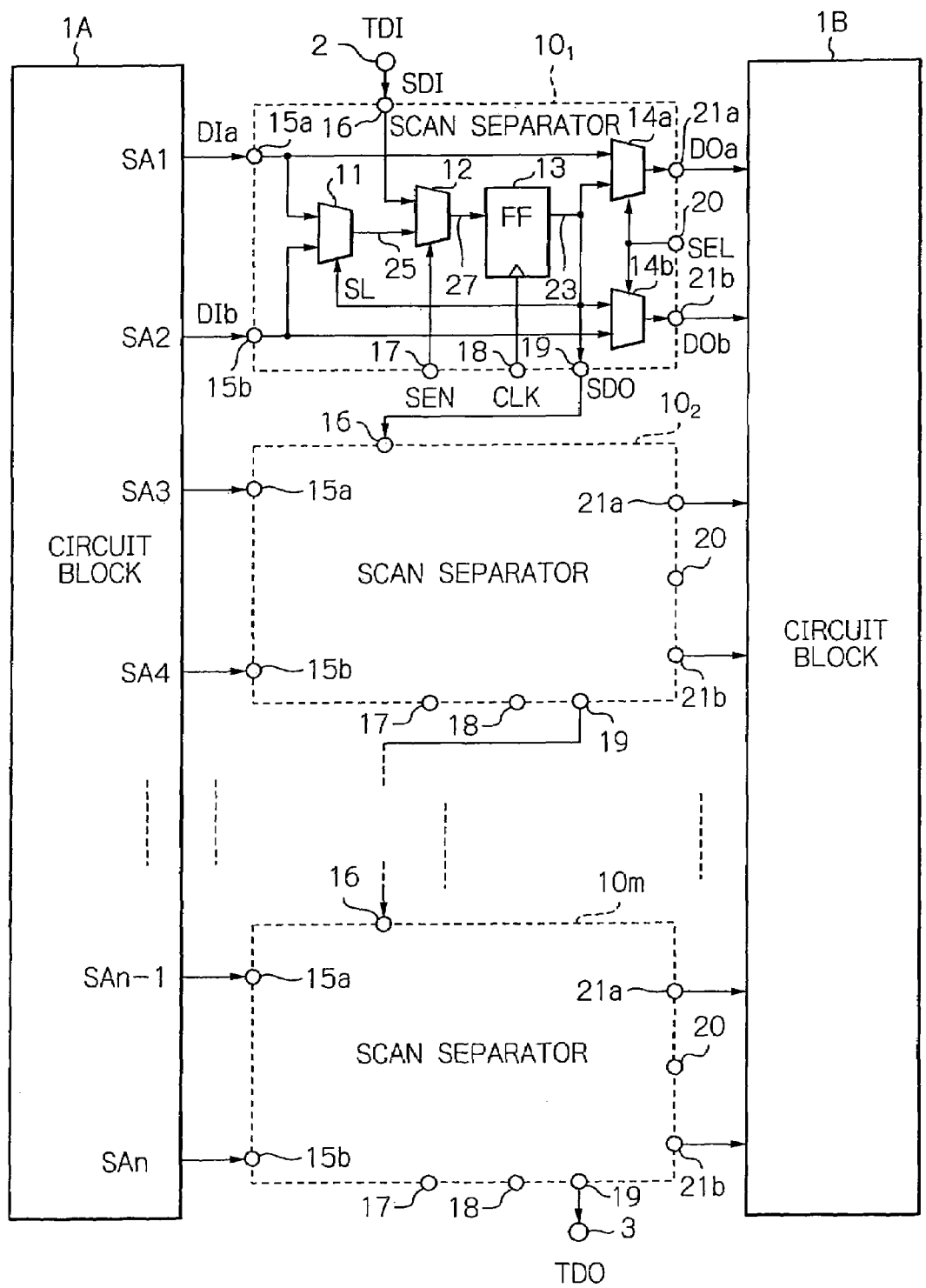
FIG. 1 is a schematic circuit diagram showing a preferred embodiment of a large scale integration device in accordance with the present invention.

Now, with reference to FIG. 1, a preferred embodiment of the large scale integration (LSI) device will specifically described in accordance with the present invention. The semiconductor large scale integration device includes combinatorial circuits, or circuit blocks 1A and 1B. The one circuit block 1A has a plurality, n, of output ports SA1 through SAn, where n is an even natural number more than unity. The large scale integration device includes a plurality, m, of scan separating circuit blocks, or scan separators, $10_1$ to $10_m$, where the number m is one half of the even number n.

Specifically, the scan separators $10_1$ to $10_m$ are provided every two signal lines for signals SA1 to San, and interconnect the circuit blocks 1A and 1B, as illustrated. The circuit blocks 1A and 1B are thus interconnected with the plurality of scan separators $10_1$ to $10_m$, which are further interconnected in serial to each other to form a cascade of stages. The scan separators $10_1$ to $10_m$ are of the same configuration, and each include selectors 11, 12, 14a and 14b, and a flip flop 13, which are interconnected as illustrated.

The scan separator 10 has its data input terminals 15a and 15b supplied with a pair of input data DIa and DIb from the circuit block 1A, respectively. The scan separator 10 also has its scan input terminal 16 interconnected to be supplied with scan data SDI from outside in the first stage of the cascaded connection, and from the scan separator 10 of the preceding one of the cascaded stages in the direction of ascending order of the suffix of the reference numerals designating the scan selectors $10_1$ to $10_m$, i.e. in the direction of the signal flow. The data input terminals 15a and 15b are connected to first and second inputs of the selector 11, respectively, while being connected to first inputs of the selectors 14a and 14b, also respectively. The selector 11 has its output 25 connected also to the first input of the selector 12, which has its second input connected to the scan input terminal 16. The selector 12 is switched in response to the scan control signal SEN supplied to the scan control terminal 17.

The selector 12 has its output connected to the input of the flip flop 13. The flip flop 13 is adapted to latch input side data in response to the clock signal CLK supplied to a clock terminal 18. The flip flop 13 has its output connected to the second inputs 23 of the selectors 14a and 14b and to a scan output terminal 19 outputting a scan output signal SDO. The flip flop 13 is adapted to deliver an output signal in the form of input selector signal SL to the selector 11. The selectors 14a and 14b are adapted to be switched in response to the output selector signal SEL, provided to a selection terminal 20. The so selected data are output from output terminals 21a and 21b in the form of output data DOa and DOb, which are in turn sent to the circuit block 1B.

The scan separator $10_1$ of the initial stage has its scan input terminal 16 connected to the test input terminal 2, serially supplied with the test data TDI from outside, while the scan separator $10_m$ of the of the last stage has its scan output terminal 19 connected to the test output terminal 3, adapted for outputting to outside test data TDO representative of the results of the processing. In the intermediate stages, i.e. ones other than the initial and final stages, each of the scan separators $10_2$ to $10_{m-1}$ has its scan output terminal 19 connected to the scan input terminal 16 of the scan separator of the stage following thereto.

In the large scale integration device of the illustrative embodiment, the selectors 14a and 14b of the scan separators $10_1$ to $10_m$ are adapted to be switched to the first input ports in response to the output selector signal SEL in the ordinary operation. This causes the data input terminals 15a and 15b of the scan separators $10_1$ to $10_m$ to be connected via the selectors 14a and 14b to the output terminals 21a and 21b, respectively. The signals SA1 to SAn will directly be sent to the circuit block 1B.

In operation, the scan separator 10 proceeds to its test operation, as will be described below. Signals or data may sometimes be designated with the reference numerals of connections on which they are conveyed.

Test data are applied to the circuit block 1B in the following fashion. Initially, the selectors 12 of the scan separators $10_1$ to $10_m$ are switched to the second input ports 16 in response to the scan control signal SEN. This forms a scan path proceeding from the test input terminal 2 through the selectors 12 of the scan separators $10_1$ to $10_m$ to the test output terminal 3.

Then, in synchronism with the clock signal CLK, m bits of test data TDI are sequentially supplied in series from the test input terminal 2. This causes the m-bit test data TDI to be held in the corresponding plurality (m) of flip flops 13 of the scan separators $10_1$ to $10_m$. In this state, the selectors 14a and 14b of the scan separators $10_1$ to $10_m$ are switched to the second input ports 23 in response to the output selector signal SEL. This causes the test data TDI to be applied to the circuit block 1B in parallel in the form of m×2 bits, i.e. n bits, of test data. It is noted that the pair of input terminals 21a and 21b of the circuit block 1B, that is, the two input terminals of the circuit block 1B which are interconnected to the same scan separator 10, are supplied with the same test data.

The results from the processing in the circuit block 1A will be read out in the following manner. Initially, the selectors 12 of the scan separators $10_1$ to $10_m$ are switched to the second input ports 16 in response to the scan control signal SEN to form a scan path from the test input terminal 2 through the flip flops 13 of the scan separators $10_1$ to $10_m$. The test data TDI, supplied to the test input terminal 2, are fixed to the logical value "0" and the clock signal CLK is supplied to hold the data "0" in the flip flops 13. This affords the input selector signal SL of the logical level "0" to the selectors 11 of the scan separators $10_1$ to $10_m$, and hence the data input terminal 15a is selected.

Next, the selectors 12 of the scan separators $10_1$ to $10_m$ are switched to the first input ports 25 in response to the scan control signal SEN. This applies odd-numbered signals SA1, SA3, . . . , SAn−1 of the circuit block 1A to the input ports of the flip flops 13 of the scan separators $10_1$ to $10_m$, respectively. In this state, when one clock pulse of the clock signal CLK is supplied, the odd-numbered signals SA1 to SAn−1 showing the processing results of the circuit block 1A are latched in the flip flops 13 of the scan separators $10_1$ to $10_m$.

The selectors 12 of the scan separators $10_1$ to $10_m$ are then switched to the second input ports 16 in response to the scan control signal SEN. This forms a scan path from the test input terminal 2 through the selectors 12 and the flip flops 13 of the scan separators $10_1$ to $10_m$ to the test output terminal 3. In this state, when the test data TDI, supplied to the test input terminal 2, are fixed at the logical level "1" and the clock signal CLK is supplied, the odd-numbered data, showing the processing results of the circuit block 1A and latched by the flip flops 13 of the scan separators $10_1$ to $10_m$, are sequentially shifted in synchronism with the clock signal CLK and serially output as the m bits pf test data TDO from the test output terminal 3. The flip flops 13 of the scan separators $10_1$ to $1O_m$ hold the data having logical level "1", and thence the selectors 11 select the data input terminals 15b.

The selectors 12 of the scan separators $10_1$ to $10_m$ are now switched to the first input ports 25 in response to the scan control signal SEN. This affords the even-numbered signals SA2, SA4, . . . , SAn to the input ports 27 of the flip flops 13 of the scan separators $10_1$ to $10_m$. Under this condition, in response to one clock pulse of the clock signal CLK supplied, the even-numbered signals SA2 to SAn showing the processing results of the circuit block 1A are latched in the flip flops 13 of the scan separators $10_1$ to $10_m$.

The selectors 12 of the scan separators $10_1$ to $10_m$ are then again switched to the second input ports 16 in response to the scan control signal SEN. This causes a scan path to be established from the test input terminal 2 through the selectors 12 and the flip flops 13 of the scan separators $10_1$ to $10_m$. In this state, when the clock signal CLK is applied, the even-numbered signals, indicating the processing results of the circuit block 1A and latched by the flip flops 13 of the scan separators $10_1$ to $10_m$, are sequentially shifted in synchronism with the clock signal CLK to be serially output in the form of test data TDO of m bits from the test output terminal 3.

When the even-numbered test data of the processing results of the circuit block 1A are shifted and read out from the test output terminal 3, the test data TDI to be afforded next time to the circuit block 1 are entered from the test input terminal 2, thus the completion of reading out the test data TDO is able to simultaneously cause the transfer of the test data TDI to the flip flops of the scan separators $10_1$ to $10_m$ to be completed.

The large scale integration device of the embodiment includes, in place of the conventional scan separators 30, the scan separators 10 which have only two selectors added so as to halve the number of the scan separators. It is therefore advantageous that the scale of the integrated circuit may be suppressed from increasing. It is noted that, with the present scan separators 10, limitations are imposed on the combinations of the test data to be afforded to the circuit block 1B. If the signal lines which may be supplied with the same data are combined with each other to be connected to the same scan separator 10, then no practical inconvenience may arise.

Figure 3:
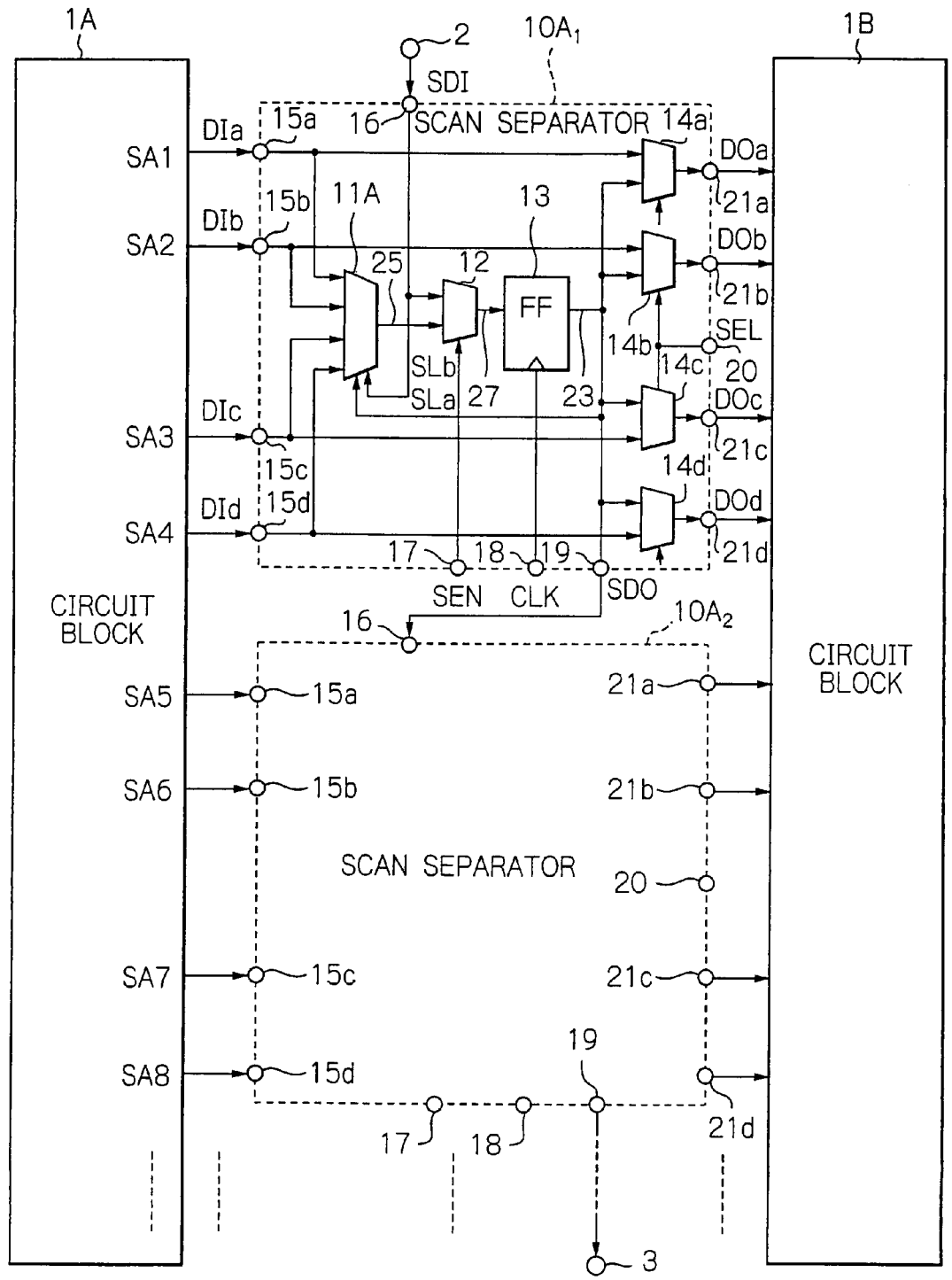
FIG. 3 is a schematic circuit diagram of a large scale integration device according to an alternative embodiment of the present invention.

Now, reference will be made to FIG. 3, which schematically shows in a circuit diagram a large scale integration device according to an alternative embodiment of the invention. In the following, like parts or components are of course designated with the same reference numerals.

In the large scale integration device of the embodiment describe earlier, each scan separator 10 is provided for every two signal lines SA- and SB-interconnecting the circuit blocks 1A and 1B with each other. In the alternative embodiment, each scan separator 10A is provided for every four signal lines SA-interconnecting the circuit blocks 1A an 1B with each other, thereby further reducing the scale of the entire circuit.

There are provided plural scan separators 10A of the same configuration, each being composed of a four-input selector 11A, the two-input selector 12, the two-input selectors 14a to 14d, and the flip flop 13. Each scan separator 10A also has its data input terminals 15a to 15d, supplied with input data DIa to DId, respectively from the circuit block 1A over four signal lines (SA1-SA4 in the scan separator that is fully illustrated in FIG. 3). The scan separator $10A_1$ in the first stage also has its scan input terminal 16, supplied with scan data SDI from outside. Each scan separator $10A_2$ et seq. in the stages following the first one has its scan input terminal 16, supplied with scan data SDI from the scan separator 10A- of its preceding stage. The data input terminals 15a to 15d are connected to the first to fourth input ports of the selector 11A, while being connected to the first input ports of the selectors 14a to 14d, respectively. The selector 11A has its output port 25 connected to the first input port of the selector 12, which has its second input port connected to the scan input terminal 16.

The selector 12 has its output port 27 interconnected to the input port of the flip flop 13, which has its output port 23 connected to the second input ports of the selectors 14a through 14d and to the scan output terminal 19. The flip flop 13 is adapted to supply its output signal 23 also to the selector 11A as an input selector signal SLa. The combination of the input selector signals SLa and SLb causes either one of the four input signals 15a through 15d to be selected.

The selectors 14a to 14d are switched in response to the output selector signal SEL supplied to the selection terminal 20. The data thus selected are output from data output terminals 21a to 21d in the form of output data DOa to DOd, respectively, which are then supplied to the circuit block 1B. In other respects, the instant alternative embodiment is similar in configuration to the illustrative embodiment shown in and described with reference to FIG. 1.

The alternative embodiment operates to supply the test data to the circuit block 1B through the scan separator 10A in a fashion similar to that of the embodiment shown in FIG. 1 except that the test data TDI held by the flip flops 13 of the scan separators 10A is supplied in common to the four signal lines.

The alternative embodiment also operates in a manner similar to how the embodiment shown in FIG. 1 reads out the data of the processing results of the circuit block 1A through the scan separators 10A, except that data are read out from selected one of the four signal lines DIa through DId in accordance with the combination of the input selector signal SLa retained by and supplied from the flip flop 13 of each scan separator 10A with the input selector signal SLb supplied to the scan input terminal 16 from outside or from the scan separators 10A of the preceding stage. The system is thus adapted for selecting either of the four combinations of input selector signals SLa and SLb, thus allowing all the data of the processing results to be read out.

The large scale integration device of the present alternative embodiment includes, in place of the conventional scan separator 30, the scan separator 10A having only one four-input selector and three two-input selectors additionally incorporated, thus reducing the scan separators to one-fourth in number. Hence, it is advantageous that the entire circuit scale may further be suppressed from increasing. It is noted that, with the present scan separators 10A, limitations are imposed on the combination of the test data to be afforded to the circuit block 1B, as with the illustrative embodiment shown in FIG. 1. No practical inconvenience may however arise by taking measures similar to those taken for the embodiment shown in FIG. 1.

Figure 4:
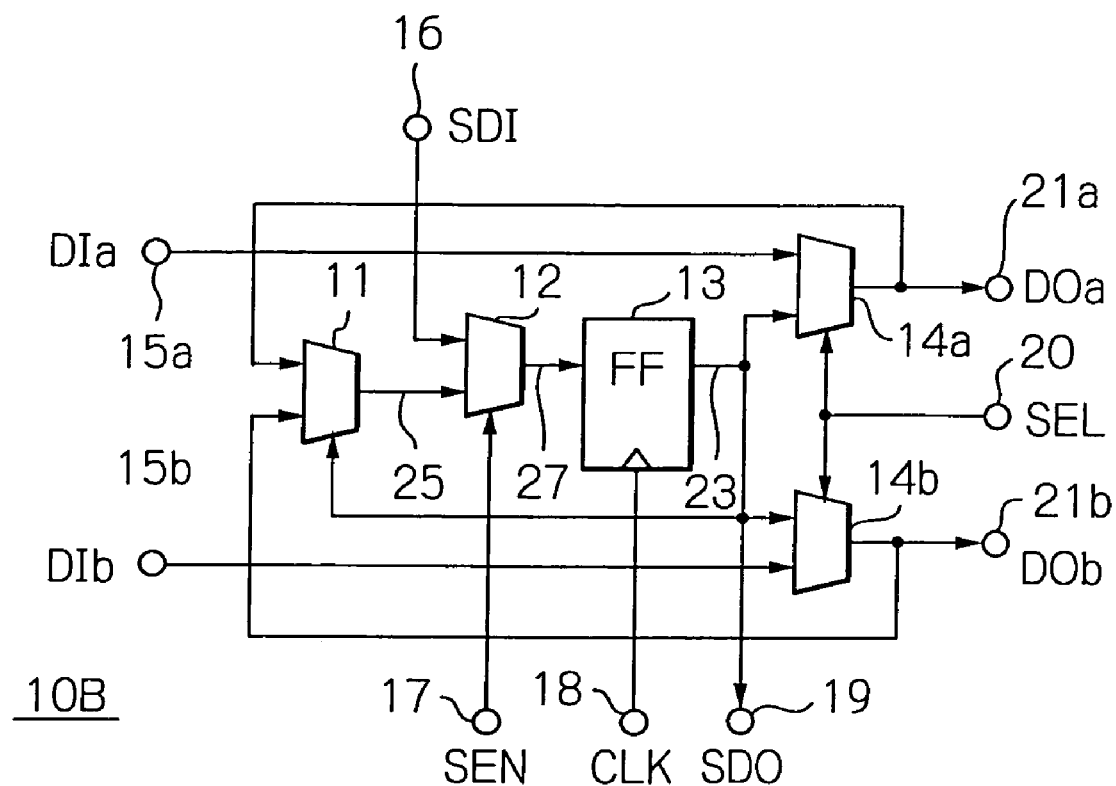
FIG. 4 is a schematic circuit diagram showing a scan separator according to a further alternative embodiment of the present invention.

Now reference will be made to FIG. 4, schematically depicting the circuit structure of a scan separator 10B according to a further alternative embodiment of the invention. The scan separator 10B is provided in place of the scan separator 10 shown in FIG. 1. In FIG. 4, like parts or components are of course designated with the same reference numerals.

In the scan separator 10 shown in FIG. 1, the data input terminals 15a and 15b are connected to the input ports of the selector 11. Instead, with the scan separator 10B shown in FIG. 4, the output ports 21a and 21b of the selectors 14a and 14b, respectively, are connected to the input port of the selector 11. In other respects, the present alternative embodiment may be of the same configuration as that shown in FIG. 1.

With the scan separator 10B, when the data of the processing results of the circuit block 1A are read out, the selectors 14a and 14b are switched to the input ports of selector 11 in response to the output selector signal SEL. The input data DIa and DIb, supplied from the data input terminals 15a to 15b, respectively, are output to the selector 11 through the selectors 14a and 14b. The input data DIa or DIb are latched via the selector 12 in the flip flop 13.

Hence, the scan separator 10B of the further alternative embodiment has, in addition to the advantage with the illustrative embodiment shown in FIG. 1, the advantage that the testing may be carried out which also includes the test of the normality of the passage from the data input terminals 15a to 15d through the selectors 14a and 14b to the data output terminals 21a and 21b.

The entire disclosure of Japanese patent application No. 2004-367220 filed on Dec. 20, 2004, including the specification, claims, accompanying drawings and abstract of the disclosure, is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A semiconductor integrated circuit comprising a first circuit block, a second circuit block and a plurality of scan separators transferring, in ordinary operation, signals between said first and second circuit blocks and isolating, in a testing operation, said first and second circuit blocks from each other, wherein
    each of said plurality of scan separators is provided for two of the signals transferred from said first circuit block to said second circuit block, and interconnected in cascaded stages,
    each of said plurality of scan separators comprising:
    a first selector for selecting one of the two signals output from said first circuit block in response to an input selector signal;
    a second selector for selecting scan data supplied from outside or from one of the plurality of scan separators in one of the cascaded stages which precedes when receiving a scan control signal, said second selector being adapted for selecting an output signal of said first selector when not receiving the scan control signal;
    a flip flop for holding an output signal of said second selector to output the output signal in a form of scan data to outside or to one of said plurality of scan separators which follows in the cascaded stages, and for sending the output signal to said first selector as the input selector signal in response to a clock signal; and
    a third selector, which receives one of the two signals and the output signal of said flip flop as inputs, for selecting said one of the two signals or the output signal of said flip flop in response to an output selector signal, and for supplying the selected signal to said second circuit block.

2. The semiconductor integrated circuit of claim 1, wherein each of said scan separators further comprises an additional third selector for selecting the other of the two signals or the output signal of said flip flop in response to said output selector signal, and for supplying the signal selected by said additional third selector to said second circuit block.

3. A semiconductor integrated circuit comprising a first circuit block, a second circuit block and a plurality of scan separators transferring, in ordinary operation, signals between said first and second circuit blocks and isolating, in a testing operation, said first and second circuit blocks from each other, wherein
    each of said plurality of scan separators is provided for four of the signals transferred from said first circuit block to said second circuit block, and interconnected in cascaded stages,
    each of said plurality of scan separators comprising:
    a first selector for selecting one of the four signals output from said first circuit block in accordance with a combination of a first input selector signal and a second input selector signal, the first input selector signal being scan data supplied from outside or from one of the plurality of scan separators in one of the cascaded stages which precedes;
    a second selector for selecting scan data supplied from outside or from one of the plurality of scan separators in one of the cascaded stages which precedes when receiving a scan control signal, said second selector being adapted for selecting an output signal of said first selector when not receiving the scan control signal;
    a flip flop for holding an output signal of said second selector to output the output signal in a form of scan data to outside or to one of said plurality of scan separators which follows in the cascaded stages, and for sending the output signal to said first selector as the second input selector signal in response to a clock signal; and
    a third selector, which receives one of the four signals and the output signal of said flip flop as inputs, for selecting said one of the four signals or the output signal of said flip flop in response to an output selector signal, and for supplying the selected signal to said second circuit block.

4. The semiconductor integrated circuit of claim 3, wherein each of said scan separators further comprises a plurality of additional third selectors for selecting others of the four signals or the output of said flip flop in response to said output selector signal, and for supplying signals selected by said additional third selectors to said second circuit block.

5. A semiconductor integrated circuit comprising a first circuit block, a second circuit block and a plurality of scan separators transferring, in ordinary operation, signals between said first and second circuit blocks and isolating, in a testing operation, said first and second circuit blocks from each other, wherein
    each of said plurality of scan separators is provided for two of the signals transferred from said first circuit block to said second circuit block, and interconnected in cascaded stages,
    each of said scan separators comprising:
    a first selector, which receives one of the two signals output from said first circuit block and a held signal, for selecting said one of the two signals output from said first circuit block or the held signal in response to an output selector signal to supply a selected signal to said second circuit block;
    a second selector for selecting one of the two signals output from said first selector in response to an input selector signal;
    a third selector for selecting scan data supplied from outside or from one of the plurality of scan separators in one of the cascaded stages which precedes when receiving a scan control signal, said third selector being adapted for selecting an output signal of said second selector when not receiving the scan control signal; and
    a flip flop for holding an output signal of said third selector to output the held signal in a form of scan data to outside or to one of said plurality of scan separators which follows in the cascaded stages, and for sending the held signal to said second selector as the input selector signal in response to a clock signal, the held signal additionally being supplied to the first selector.

6. The semiconductor integrated circuit of claim 5, wherein each of said scan separators further comprises an additional first selector for selecting the other of the two signals output from said first circuit block or said held signal in response to said output selector signal, the signal selected by said additional first selector being supplied to said second circuit block.

* * * * *